(12) United States Patent
Lin et al.

(10) Patent No.: US 12,098,809 B1
(45) Date of Patent: Sep. 24, 2024

(54) FULL SPECTRUM SEMICONDUCTOR LIGHTING DEVICE AND HEALTH LIGHTING FIXTURE

(71) Applicants: XUYU OPTOELECTRONICS (SHENZHEN) CO., LTD., Shenzhen (CN); GUANGDONG XUYU OPTOELECTRONICS CO., LTD., Dongguan (CN)

(72) Inventors: Jintian Lin, Shenzhen (CN); Lei Chen, Shenzhen (CN); Chao Li, Shenzhen (CN); Fu Du, Shenzhen (CN); Jilong Cai, Shenzhen (CN); Lili Deng, Shenzhen (CN)

(73) Assignees: XUYU OPTOELECTRONICS (SHENZHEN) CO., LTD., Shenzhen (CN); GUANGDONG XUYU OPTOELECTRONICS CO., LTD., Dongguan (CN)

( * ) Notice: Subject to any disclaimer, the term of this patent is extended or adjusted under 35 U.S.C. 154(b) by 0 days.

(21) Appl. No.: 18/597,963

(22) Filed: Mar. 7, 2024

(30) Foreign Application Priority Data

Sep. 18, 2023 (CN) ......................... 202311204721.X

(51) Int. Cl.
| F21K 9/64 | (2016.01) |
| C09K 11/77 | (2006.01) |
| H01L 33/50 | (2010.01) |
| F21Y 115/10 | (2016.01) |

(52) U.S. Cl.
CPC ............ *F21K 9/64* (2016.08); *C09K 11/7715* (2013.01); *C09K 11/77348* (2021.01); *H01L 33/502* (2013.01); *F21Y 2115/10* (2016.08)

(58) Field of Classification Search
CPC . F21K 9/64; C09K 11/77348; C09K 11/7715; H01L 33/502; F21Y 2115/10
See application file for complete search history.

(56) References Cited

U.S. PATENT DOCUMENTS

| 2009/0146549 A1* | 6/2009 | Kimura | ............ C09K 11/77348 313/503 |
| 2016/0260391 A1* | 9/2016 | Yeo | ...................... G09G 3/3413 |
| 2020/0341337 A1* | 10/2020 | Sato | .................. G02F 1/133603 |
| 2023/0151273 A1* | 5/2023 | Bando | .............. C09K 11/77348 257/44 |

\* cited by examiner

*Primary Examiner* — Bao Q Truong
(74) *Attorney, Agent, or Firm* — Andrew C. Cheng

(57) ABSTRACT

The invention relates to the field of lighting technology and addresses the issues of poor light efficiency and stability in existing full spectrum white light LED implementations, which provides a full spectrum semiconductor lighting device and health lighting fixture, which includes: blue light LED chips and fluorescent powders. The blue light LED chips comprise at least a first and second blue light chip, each with peak wavelengths within a specific wavelength range, differing from each other. The fluorescent powders include first, second, third, and fourth fluorescent powders, each with peak wavelengths in distinct wavelength ranges. Through the synergistic use of chips and fluorescent powders, the invention enables the resulting full spectrum lighting devices to have higher light efficiency and stability.

13 Claims, 3 Drawing Sheets

FULL SPECTRUM SEMICONDUCTOR LIGHTING DEVICE AND HEALTH LIGHTING FIXTURE

CROSS REFERENCE OF RELATED APPLICATION

The present disclosure claims priority of Chinese Patent Application CN202311204721.X, filed on Sep. 18, 2023. All of the aforementioned patent applications are incorporated herein by reference in their entirety.

FIELD OF INVENTION

The present disclosure belongs to the field of health lighting, particularly to a full spectrum semiconductor lighting device and a health lighting fixture.

DESCRIPTION OF RELATED ARTS

Full spectrum lighting technology refers to those lighting technologies that mimic the spectral characteristics of natural sunlight, aiming to provide a light environment that is more beneficial for human eyes, vision, and overall health. The ideal full spectrum lighting should include a wide range of wavelengths from ultraviolet to infrared, with special emphasis on the spectral continuity and balance within the visible light range. Health lighting mainly refers to lighting technologies, forms, facilities, and usage methods that have beneficial effects on human vision, physiological, psychological, and overall physical and mental health needs. The current main focus of health lighting technology is to make the LED light source spectrum as close as possible to the solar visible spectrum (sun-like light), reducing the relative energy of blue light to prevent blue light hazards; and increasing the relative energy of red light to promote physical and mental health. Thus, the core of achieving health lighting currently lies in developing a continuous spectrum in the visible light band that resembles the solar spectrum.

In existing technology, the realization of full spectrum white light LEDs often involves the use of blue light chips to excite fluorescent materials. The resulting white light possesses characteristics like high light efficiency and high color rendering index. However, this method produces a spectrum that has two noticeable differences compared to the solar spectrum. First, the spectral continuity is relatively poor, especially the significant lack in the 480~500 nm wavelength range, which plays an important role in regulating the human body's rhythm. Additionally, there is insufficient energy in the long-wave red light portion. Second, in the approach where a single blue light chip excites fluorescent materials, the relative intensity of the blue light is high. Prolonged use can lead to fatigue and even a decrease in vision.

Another approach to achieving full spectrum white light LEDs includes using blue light chips based on different wavelength bands to excite fluorescent materials, thereby achieving a continuous spectrum. This method can attain advantages such as low blue light, high color rendering index, and good spectral continuity. For instance, the Chinese patent with the publication number CN106449626A discloses a dual-chip blue light health LED light source. It includes two types of blue light LED chips, with their peak wavelength ranges respectively being 420-440 nm and 460-480 nm. However, the optimal excitation currents and radiant powers differ between the long-wave and short-wave chips. Due to the differences in wavelength and radiation, the effects on exciting the fluorescent materials also vary. Consequently, the obtained white light beads exhibit poor performance in terms of stability and light efficiency.

SUMMARY OF THE PRESENT INVENTION

In view of these challenges, the embodiment of the present invention provides a full spectrum semiconductor lighting device and a health lighting fixture, aiming at solving the issues of poor light efficiency and stability found in the existing approaches for realizing full spectrum white light LEDs.

On the first aspect, the present invention provides A full spectrum semiconductor lighting device, comprising:
  a blue light LED chip;
  a fluorescent powder;
  wherein the blue light LED chip comprise at least two blue light chips with peak wavelengths within a first wavelength range, and peak wavelengths of each blue light chip are different the first wavelength range is 420~480 nm;
  the fluorescent powder include a first fluorescent powder, a second fluorescent powder, a third fluorescent powder, and a fourth fluorescent powder, the peak wavelength of the first fluorescent powder lies within a second wavelength range, the peak wavelength of the second fluorescent powder lies within a third wavelength range, the peak wavelength of the third fluorescent powder lies within a fourth wavelength range, and the peak wavelength of the fourth fluorescent powder lies within a fifth wavelength range, the second wavelength range is 480~520 nm, the third wavelength range is 530~540 nm, the fourth wavelength range is 640~660 nm, and the fifth wavelength range is 680~700 nm.

Preferably, the main wavelength of the blue light LED chip is between 447~457 nm after combining each of the blue light chips.

Preferably, the second wavelength range is 495-500 nm, the third wavelength range is 530-535 nm, the fourth wavelength range is 645-650 nm, and the fifth wavelength range is 680-690 nm.

Preferably, the chemical formula of the first fluorescent powder is $Lu_3(Al_{1-x},Ga_x)_5O_{12}$:zCe, where $0.1 \leq x \leq 0.3$, and $0.003 \leq z \leq 0.008$.

Preferably, the chemical formula of the second fluorescent powder is $Lu_3Si_5N_{11}$:Ce.

Preferably, the third fluorescent powder is a composite material with a core-shell structure, and the chemical formula thereof is $K_2TiF_6$:Mn@(Ca,Sr)$AlSiN_3$:Eu.

Preferably, the molar ratio of $K_2TiF_6$:Mn to (Ca,Sr)$AlSiN_3$:Eu in the composite material is between ⅓ and 1.

Preferably, a preparation method for the third fluorescent powder $K_2TiF_6$:Mn@(Ca,Sr)$AlSiN_3$:Eu includes the following steps:
  weighing the raw materials according to the chemical formula of the third fluorescent powder,
  grinding the weighed raw materials and mix them evenly to obtain a mixture,
  sintering the mixture at a first preset sintering temperature and for a first preset sintering time to obtain an intermediate,
  crushing and performing post-process on the intermediate to obtain a precursor,
  adding reagents corresponding to the chemical formula of the third fluorescent powder to the precursor, stirring the precursor added with the reagent at a preset stirring temperature and for a preset reaction time, and, drying after the stirring to obtain K2TiF6:Mn@(Ca,Sr)AlSiN3:Eu.

Preferably, the first preset sintering time is 4~10 hours, the first preset sintering temperature is 1600~1800 degrees centigrade.

Preferably, the fourth fluorescent powder is a biphasic structure activated by $Eu^{2+}$ ions, the biphasic structure comprises $Sr_2Si_5N_8$ and $CaAlSiN_3$.

Preferably, a preparation method of the fourth fluorescent powder comprises the following steps
weighing raw materials according to the mixed molar ratio,
uniformly mixing the weighed raw materials to obtain a mixture,
sintering the mixture at a second preset sintering temperature and for a second preset sintering time to obtain a sintered material,
and, crushing and washing the sintered material to obtain the fourth fluorescent powder with a biphasic structure.

Preferably, The full spectrum semiconductor lighting device as defined in claim 11, wherein the second present sintering temperature is 1400~1500 degrees centigrade, the second sintering time is 8 hours.

Preferably, $Sr_2Si_5N_8$ is the main phase in the biphasic structure, and the mixed molar ratio of $Sr_2Si_5N_8$ to CaAlSiN is between 1 and 3.

On a second aspect, the present invention provides a health lighting fixture, comprising at least one full spectrum semiconductor lighting device as described the first aspect.
Beneficial Effect The full spectrum semiconductor lighting device and health lighting fixture provided in the embodiments of this invention, by combining at least two blue light LED chips with different peak wavelengths within the same first wavelength range and first, second, third, and fourth fluorescent powders covering different wavelength ranges, enable the semiconductor lighting device to generate a full spectrum light source that is closer to natural light. This broad spectrum coverage provides a more uniform light output, contributing to enhanced color reproduction and visual comfort of the light source.

The use of various fluorescent powders effectively converts the light emitted by the blue light LED chips, improving the light efficiency of the entire lighting system. The combination of blue light LED chips with different peak wavelengths can more effectively excite the fluorescent powders, resulting in higher light output efficiency across the entire visible spectrum. The use of blue light LED chips with different peak wavelengths helps reduce dependence on single-wavelength fluorescent powders, thereby enhancing the stability of the entire lighting system. This can minimize changes in light output due to degradation of the fluorescent powders, ensuring consistency of the light source over long-term use.

Overall, the design of this full spectrum semiconductor lighting device not only improves the light efficiency and stability of the light source but also optimizes the spectral output, making it more in line with the requirements of health lighting and suitable for various lighting environments.

BRIEF DESCRIPTION OF THE DRAWINGS

To provide a clearer understanding of the technical solutions of embodiments of the present invention, the following brief descriptions of the accompanying drawings used in the embodiments will be provided. It should be understood by those skilled in the art that, without exerting any creative effort, additional drawings can be derived based on these drawings, and all such variations are within the scope of the present invention.

DETAILED DESCRIPTION

Figure 1:
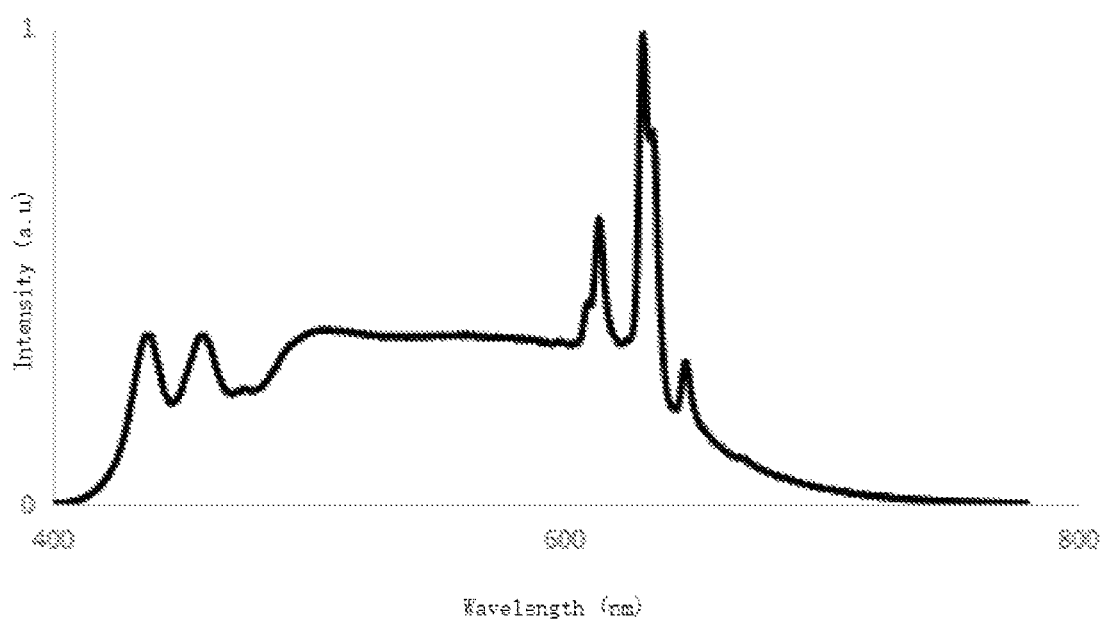
FIG. 1 is the spectral graph of the full spectrum semiconductor lighting device in Example 1 of Embodiment 2.

In order to provide a clear and comprehensive description of the objectives, technical solutions, and advantages of the embodiments of the present invention, the following detailed description will be provided in conjunction with the embodiments of the present invention. It should be noted that in this document, terms such as "first" and "second" are used merely to distinguish one entity or operation from another, and do not necessarily imply any actual relationship or order between these entities or operations. In the description of the present invention, it should be understood that terms such as "center," "up," "down," "front," "back," "left," "right," "vertical," "horizontal," "top," "bottom," "inner," "outer," and the like indicate orientations or positional relationships based on the orientations or positional relationships shown in the drawings, and are used for the purpose of facilitating the description and simplifying the description, rather than indicating or implying that the device or component referred to must have a specific orientation or be constructed and operated in a specific orientation. Therefore, they should not be understood as limiting the present invention. Furthermore, terms such as "comprise," "include," or any other variations thereof are intended to encompass non-exclusive inclusion, such that processes, methods, articles, or devices comprising a series of elements include not only those elements explicitly listed, but also other elements that are not explicitly listed but are inherent to such processes, methods, articles, or devices. Unless otherwise limited, the elements defined by the phrase "comprising . . . " do not exclude the presence of additional identical elements in the processes, methods, articles, or devices that include the elements. If not conflicting, the embodiments and features thereof may be combined with each other and fall within the scope of protection of the present invention.

Embodiment 1

The present invention provides a full spectrum semiconductor lighting device, comprising:
a blue light LED chip;
a fluorescent powder;
wherein the blue light LED chip comprise at least two blue light chips with peak wavelengths within a first wavelength range, and peak wavelengths of each blue light chip are different the first wavelength range is 420~480 nm;

The fluorescent powder include a first fluorescent powder, a second fluorescent powder, a third fluorescent powder, and a fourth fluorescent powder, the peak wavelength of the first fluorescent powder lies within a second wavelength range, the peak wavelength of the second fluorescent powder lies within a third wavelength range, the peak wavelength of the third fluorescent powder lies within a fourth wavelength range, and the peak wavelength of the fourth fluorescent powder lies within a fifth wavelength range, the second wavelength range is 480~520 nm, the third wavelength range is 530~540 nm, the fourth wavelength range is 640~660 nm, and the fifth wavelength range is 680~700 nm.

Specifically, the blue light LED chips serve as the primary light source, emitting blue light that is absorbed by different fluorescent powders. These blue light chips not only directly provide spectral components in the blue light region but also excite the luminescence of the fluorescent powders. In this embodiment, the blue light LED chips include at least a first and a second blue light chip with peak wavelengths within the same first wavelength range. Although the peak wavelengths of the first and second blue light chips are different but in the same wavelength range. The use of blue light chips with different peak wavelengths can cover a broader blue light region. This not only enhances the spectral continuity in the blue light area but also more effectively excites various types of fluorescent powders, thus producing a richer and more uniform spectral output. This combination method helps improve the spectral distribution of the entire light source, making the light emitted by the device closer to natural light. The combination of different wavelengths of blue light helps to reduce any gaps in the spectrum, especially in the transition area between blue and green light. By optimizing the combination of peak wavelengths of the blue light chips, the color rendering of the entire light source can be improved. Furthermore, by reasonably selecting the peak wavelengths of the blue light chips, it is possible to maintain high light efficiency while reducing the proportion of harmful high-energy blue light output, which is particularly important for people who work or live under artificial light conditions for extended periods.

Furthermore, the full spectrum semiconductor lighting device includes four different types of fluorescent powders, each with its peak wavelength in a distinct wavelength range: the peak wavelength of the first fluorescent powder is in the range of 480-520 nm, the peak wavelength of the second fluorescent powder is in the range of 530-540 nm, the peak wavelength of the third fluorescent powder is in the range of 640-660 nm, and the peak wavelength of the fourth fluorescent powder is in the range of 680-700 nm. Such a design allows the fluorescent powders to cover a wide wavelength range from blue to red light.

The excited fluorescent powders absorb blue light and emit light of different colors. Each type of fluorescent powder is carefully selected to emit light in a specific wavelength range, thereby supplementing the spectrum of the blue light LED chips. Specifically, the first fluorescent powder converts part of the blue light into green light in the second wavelength range of 480-520 nm. In the spectrum, green light, positioned between blue and yellow light, is one of the colors to which the human eye is most sensitive. Green light is very important for color reproduction in everyday lighting and display devices. The second fluorescent powder converts part of the blue light into yellow-green light in the third wavelength range of 530-540 nm, a color slightly warmer than pure green, contributing to a warmer and more comfortable lighting effect. The third fluorescent powder converts part of the blue light into red light in the fourth wavelength range of 640-660 nm. Red light, at the other end of the spectrum, is typically used to create warm and relaxing lighting environments and is a key component for achieving full-color display in display technology. The fourth fluorescent powder converts part of the blue light into the fifth wavelength range of 640-700 nm. This range also corresponds to red light, but with a longer wavelength than the fourth wavelength range, nearing the infrared region of the spectrum. This deeper red light is often used in specific types of lighting applications, such as regulating circadian rhythms and therapeutic lighting.

These different wavelength ranges are achieved through their respective fluorescent powders, enabling the full-spectrum semiconductor light-emitting device to cover a wide range of the visible spectrum. As a result, it produces light closer to natural light, which is beneficial for both visual perception and overall health.

Preferably, after combining each of the blue light chips, the main wavelength of the blue light LED chips is between 447~457 nm.

Specifically, the main wavelength refers to the wavelength corresponding to the point of highest light intensity in the emission spectrum of a light source. For a system composed of multiple blue light LED chips with different peak wavelengths, the main wavelength is the wavelength corresponding to the strongest light intensity in the combined output spectrum of these different wavelengths. In other words, although individual blue light chips may have different peak wavelengths, when they are combined, the light output of the entire system reaches its highest at a certain specific wavelength, which is referred to as the main wavelength.

Blue light chips with different peak wavelengths can be meticulously designed and matched so that their light output forms a combined, stronger spectral peak in the 447-457 nm range.

This wavelength interval optimizes the excitation efficiency of fluorescent powders. Blue light in this range can more effectively excite a variety of fluorescent powders, causing them to emit a broader and more uniform spectrum, including wavelengths of red, green, and yellow light. This helps to create a more complete spectrum, closer to natural light. When the spectrum of a light source is more comprehensive and balanced, it can more accurately reproduce the true colors of objects, thereby improving the color rendering index. This is because the color rendering index is an important metric for evaluating the color reproduction ability of a light source, and a more comprehensive spectrum contributes to enhancing this metric.

If the main wavelength of the combined chips falls below 447 nm or above 457 nm, it might lead to decreased excitation efficiency of the fluorescent powders or uneven spectral distribution, thereby affecting the color rendering index. A wavelength too low may result in excessively strong blue light, whereas a wavelength too high might not effectively excite certain fluorescent powders. Both scenarios could lead to an incomplete spectrum of the light source, failing to fully cover all colors in the human-visible spectrum, and consequently affecting its color reproduction capability.

Furthermore, blue light within this wavelength range is suitable for producing a more natural white light color temperature, which helps better simulate natural light and poses less potential harm to human eyes. Additionally, blue light in this wavelength range has good excitation efficiency for many commonly used fluorescent powders, contributing to improved overall light efficiency and color rendering. As the excitation efficiency of the fluorescent powders increases, the light efficiency of the entire lighting system is enhanced, leading to more efficient energy use.

Through the combined excitation of wavelengths in this range, the fluorescent powders can generate a spectrum that significantly improves the color rendering index of the lighting device, reaching or exceeding 98. This means that the light source can very closely match the color reproduction performance of natural light. If the main wavelength of the combined chips falls below 447 nm or exceeds 457 nm, it will lead to a reduced CRI, unable to reach 95. A main wavelength lower than 447 nm might indicate an overly strong blue light component, while a wavelength higher than 457 nm could reduce the excitation efficiency of certain fluorescent powders. Both situations can affect the overall color performance of the light source.

In conclusion, by meticulously designing the combination of blue light LED chips to achieve a main wavelength of 447~457 nm, it's possible not only to enhance the light efficiency and color performance of the source but also to improve the visual comfort and healthiness for the user. This is a significant advantage for both commercial and residential lighting applications.

In one embodiment, each blue light chip in the blue light LED chip is excited by the same target excitation current, causing the main wavelength of the blue light LED chip to be between 447 and 457 nm.

Specifically, in the blue LED chip, each blue chip has a different peak wavelength. The optimal excitation current values for long-wave and short-wave LED chips may differ due to their different wavelengths. Furthermore, because of the wavelength disparity, there will also be variations in radiant power.

Firstly, different excitation currents may result in varying luminous intensities among the blue light chips, thereby causing uneven light output in the overall illumination component. This non-uniformity could potentially affect the lighting effect and consistency of the LED lamp to some extent.

Secondly, using different excitation currents for blue light chips may lead to discrepancies in their lifespan and luminous decay rates. This could result in partial failure or reduced light output of some blue light chips after a period of use, impacting the stability of the entire LED component. Additionally, different excitation currents may generate varying levels of heat for different blue light chips, thereby affecting the temperature distribution of the LED component. If the temperature distribution is uneven, it could potentially affect the performance and stability of the LED component.

To ensure the stability of the LED component, appropriate excitation current control is necessary for each blue light chip to maintain consistency in their performance and characteristics as much as possible. Therefore, in this embodiment, each blue light chip in the blue LED chip array is excited by the same target excitation current, resulting in the main wavelength of the blue light chip being between 447 and 457 nanometers.

By adjusting the current of each blue light chip, its radiant power can be controlled. Increasing the current will increase the radiant power, while decreasing the current will reduce the radiant power. Therefore, based on the optimal excitation current for each blue light chip with different peak wavelengths and the desired combination of the main wavelength to be achieved, the target excitation current is determined. This ensures that each blue light chip in the blue LED chip array emits light with a main wavelength between 447 and 457 nanometers under the same target excitation current.

The current value of the target excitation current is determined through the following steps:

S10 of obtaining parameter data for each blue light chip in the blue LED chip, wherein the parameter data includes peak wavelength and optimal excitation current.

S20 of based on the parameter data, establishing a wavelength-current model for each blue light chip, where the wavelength-current model characterizes the relationship between the actual peak wavelength of different blue light chips and the current.

S30 of utilizing the wavelength-current model and the preset main wavelength, obtain several initial excitation current values.

S40 of calculating the variance between several initial excitation current values and the optimal excitation current values for each blue light chip.

S50 of selecting the initial excitation current value with the smallest variance as the current value for the target excitation current.

Specifically, the process begins by collecting parameter data for each blue light chip from data sheets or specification manuals provided by the manufacturer. This data includes peak wavelength and optimal excitation current values for each chip. These data serve as the foundation for subsequent modeling and calculations.

Using the collected parameter data, a wavelength-current model is established for each blue light chip. This model describes the relationship between the actual peak wavelength and the excitation current, which can range from simple linear models to more complex nonlinear models.

Based on the wavelength-current model and the predetermined main wavelength, several initial excitation current values are obtained through calculation or simulation. These initial excitation current values are such that they all enable the blue light chips to achieve the predetermined main wavelength, which falls within the range of 447 to 457 nanometers.

Subsequently, the variance between the initial excitation current values and the optimal excitation current values for each blue light chip is calculated. The initial excitation current value with the smallest variance is then selected as the target excitation current value.

When the excitation current of a blue light chip approaches its optimal value, the luminous performance of the blue light chip is typically optimal. Therefore, ensuring that the current for all blue light chip is as close as possible to their optimal values can maximize the consistency of light output among blue light chips, making the light output of the blue light LED chip more stable and consistent.

Additionally, since the emission characteristics of each blue light chip are typically optimal at its optimal excitation current value, by ensuring that the current for all blue light chip is as close as possible to their optimal values, the spectral characteristics of the blue light LED chip can be optimized. This results in a more uniform and accurate wavelength and color of the combined light.

By employing a uniform excitation current, differences among blue light chips can be minimized, reducing the likelihood of system instability or inconsistency. This, in turn, enhances the reliability and stability of the system.

Preferably, the second wavelength range is 495-500 nm, the third wavelength range is 530-535 nm, the fourth wavelength range is 645-650 nm, and the fifth wavelength range is 680-690 nm.

In this embodiment, the peak wavelengths of the first, second, third, and fourth fluorescent powders are precisely defined within the specific wavelength ranges of 495-500 nm, 530-535 nm, 645-650 nm, and 680-690 nm, respectively. This design significantly benefits the realization of a more continuous spectrum, improving both the color rendering index and the light efficiency.

Specifically, the peak wavelength of the first fluorescent powder is confined to the 495-500 nm range, which falls between green and blue-green in the spectrum. This helps to bridge the gap between the blue light of the LED and the yellow-green spectrum, resulting in a more continuous and balanced overall spectrum. The peak wavelength of the second fluorescent powder is set within the 530-535 nm range, corresponding to yellow-green light. This color holds a significant position in the spectrum, contributing to the enhancement of the sensation of natural white light and the improvement of the color rendering index. The third fluorescent powder's peak wavelength is defined in the 645-650 nm range, with light in this range belonging to the red category, crucial for providing warm light tones and enhancing red spectral components. The fourth fluorescent powder is confined to the 680-690 nm range, which is closer to the infrared spectrum, further strengthening the red light output and enhancing the warmth and color rendition of the light source.

Precisely selecting the peak wavelengths of these fluorescent powders helps to generate a more continuous and comprehensive spectrum. This spectrum is visually closer to natural sunlight, which is considered the ideal full spectrum light source with a very high color rendering index. By mimicking the spectral distribution of sunlight, this device is able to provide high-quality lighting that renders colors more accurately and vividly.

Due to the improved continuity and comprehensiveness of the spectrum, the color rendering index is significantly enhanced. A high color rendering index means that the light source can more accurately reproduce the true colors of objects, which is particularly important for applications such as retail displays, art lighting, and interior design. Additionally, the optimized combination of fluorescent powders also helps to increase the overall light efficiency, i.e., the conversion efficiency from electrical energy to light energy, making the lighting system more energy-efficient.

In summary, by optimizing the peak wavelengths of the fluorescent powders, this invention can provide a continuous spectrum that is closer to the solar spectrum, thereby achieving high color rendering and high light efficiency, which meets the demands of high-standard lighting requirements.

Preferably, the chemical formula of the first fluorescent powder is $Lu_3(Al_{1-x},Ga_x)_5O_{12}:zCe$, where $0.1 \leq x \leq 0.3$, $0.003 \leq z \leq 0.008$.

Specifically, the chemical formula of the first fluorescent powder is $Lu_3(Al_{1-x},Ga_x)_5O_{12}:zCe$, which is a fluorescent powder with a modified garnet structure, the design thereof optimizes the performance characteristics of fluorescent powder, especially in terms of stability, luminescence peak wavelength, half-peak width and brightness, where value of x represents the replacement ratio of gallium, which is between 0.1 and 0.3. If the value of x is too low, the substitution of $Ga^{3+}$ is not enough to significantly affect the lattice structure, so the blue shift of the spectral peak wavelength is not obvious. On the contrary, if the x value is too high, it may lead to instability of the crystal structure and affect the brightness and performance of the fluorescent powder;

In $Lu_3(Al_{1-x},Ga_x)_5O_{12}:zCe$, $Al^{3+}$ is replaced by $Ga^{3+}$. Since the ionic radius of $Ga^{3+}$ is larger than that of $Al^{3+}$, this substitution causes a slight expansion of the crystal lattice, thereby achieving a blue shift of the peak wavelength. Blue shift refers to the shift of the peak wavelength toward the blue region of the spectrum, which is crucial for adjusting the color of the light emitted by the fluorescent powder;

Compared to conventional nitride phosphors (such as $BaSi_2O_2N_2:Eu$), modified garnet-structured fluorescent powder exhibits higher thermal and chemical stability. By precisely controlling the substitution ratios of Ga and Ce, it is possible to optimize the luminescent properties of the fluorescent powders, such as peak wavelength, half-peak width, and brightness.

Specifically, the chemical formula of the second fluorescent powder is $Lu_3Si_5N_{11}:Ce$. Compared to garnet-structured fluorescent powders, $Lu_3Si_5N_{11}:Ce$ demonstrates higher thermal stability. This makes it particularly suitable for use under high-power excitation conditions, such as in commercial and industrial lighting applications where strong light output is needed.

Moreover, $Lu_3Si_5N_{11}:Ce$ can be efficiently excited in the 440-480 nm wavelength band, especially showing excellent excitation efficiency around 460 nm. This means it can effectively pair with blue light LED chips of different wavelengths to produce a rich spectral output.

Compared to $La_3Si_5N_{11}:Ce$ fluorescent powder, $Lu_3Si_5N_{11}:Ce$ has a different structure, offering better high-temperature excitation stability and a narrower half-peak width. This results in a more continuous spectral output and a higher color rendering index. Therefore, based on the excellent emission spectrum, excitation spectrum, and stability of this fluorescent powder system, its application in full-spectrum devices leads to higher optoelectronic parameters and spectral performance.

Preferably, the third fluorescent powder is a composite material with a core-shell structure, and chemical formula thereof is $K_2TiF_6:Mn@(Ca,Sr)AlSiN_3:Eu$.

Specifically, the third fluorescent powder $K_2TiF_6:Mn@(Ca,Sr)AlSiN_3:Eu$ is a composite material with a core-shell structure. The core-shell structure offers a unique way to combine two different types of fluorescent powders. It involves a fluoride coating on a base of $(Ca,Sr)AlSiN_3:Eu$, forming a multi-phase hybrid composite. This core-shell fluorescent powder is suitable for synergistic excitation by both long and short wavelengths, achieving higher light efficiency. The core material $K_2TiF_6:Mn$ and the shell material $(Ca,Sr)AlSiN_3:Eu$ in this structure not only improve the excitation efficiency of the fluorescent powder but also enhance its optical and thermal stability.

Traditional $(Ca,Sr)AlSiN_3:Eu$ nitride fluorescent powders exhibit good excitation effects under short-wave blue light but have lower excitation efficiency under long-wave blue light. By combining them with K2TiF6:Mn, synergistic excitation suitable for both long and short-wave blue light can be achieved, thereby improving the overall excitation efficiency.

Preferably, in the composite material, the molar ratio of $K_2TiF_6:Mn$ to $(Ca,Sr)AlSiN_3:Eu$ is between ⅓ and 1.

Specifically, compared to (Ca,Sr)AlSiN3:Eu, $K_2TiF_6:Mn$ has a higher excitation efficiency, and since K2TiF6:Mn is coated on the outer layer, its proportion should be lower. If it's too high, it can lead to spectral imbalance, making it difficult to enhance the optoelectronic parameters and spectral performance. Therefore, in this embodiment, the molar ratio of $K_2TiF_6:Mn$ to $(Ca,Sr)AlSiN_3:Eu$ is maintained between ⅓ and 1.

If the proportion of $K_2TiF_6:Mn$ is too high, it may cause spectral imbalance, affecting the optoelectronic performance of the device. Conversely, if the ratio is too low, the absorption of long-wave blue light might be insufficient, also leading to spectral imbalance. An appropriate molar ratio helps balance the spectral output of the entire lighting system, ensuring that all types of fluorescent powders are effectively excited and their luminescent properties are optimally combined. This not only improves the overall light efficiency and color rendering index of the device but also optimizes the spectral distribution to more closely resemble natural light. By adjusting the proportion of $K_2TiF_6$:Mn, the relative intensity of blue light in the device can be effectively controlled. With the help of K2TiF6:Mn, the relative intensity of blue light can be reduced, thereby minimizing the potential harm of blue light to the human eyes while maintaining high-quality light output.

The preparation method for the third fluorescent powder $K_2TiF_6$:Mn@(Ca,Sr)AlSiN$_3$:Eu includes the following steps:

Step of S1 of weighing the raw materials according to the chemical formula of the third fluorescent powder, where the raw materials include elements and/or compounds corresponding to the chemical formula.

Specifically, accurately the raw materials needed for the $K_2TiF_6$:Mn@(Ca,Sr)AlSiN$_3$:Eu fluorescent powder is weighed, which may include elements (such as calcium, strontium, aluminum, silicon, europium, etc.) and/or specific compounds. The correct proportion of raw materials is crucial for ensuring that the final product has the desired chemical composition.

Step S2 of grinding the weighed raw materials and mix them evenly to obtain a mixture.

Specifically, the weighed raw materials are ground into finer particles, which helps to improve the uniformity of the reaction. Then, these fine particles are evenly mixed to ensure a uniform reaction in the subsequent sintering process, forming the desired chemical structure.

Step S3 of sintering the mixture at a first preset sintering temperature and for a first preset sintering time to obtain an intermediate;

Specifically, the mixture is sintered at a first preset sintering temperature, which is maintained for a first sintering time. The first preset sintering temperature ranges from 1600 to 1800° C., and the preset sintering time is between 4 to 10 hours. The specific sintering temperature and time can be adjusted according to the actual situation of the raw materials and are not specifically limited here. The purpose of sintering is to promote chemical reactions between the raw materials, forming the required intermediate. This step significantly influences the crystal structure and chemical composition of the final product.

Step S4 of crushing and performing post-process on the intermediate to obtain a precursor.

Specifically, the sintered intermediate is crushed into smaller particles to increase the reaction surface area in the subsequent hydrothermal method step, thus enhancing reaction efficiency. Post-process may include cleaning, drying, etc., to prepare for the next hydrothermal reaction.

Step S5 of adding reagents corresponding to the chemical formula of the third fluorescent powder to the precursor. This step involves adding reagents related to the chemical formula of the third fluorescent powder to the crushed precursor. These reagents may contain the elements necessary for $K_2TiF_6$:Mn, required to form the core-shell structure in subsequent steps.

Step S6 of stirring the precursor added with the reagent at a preset stirring temperature and for a preset reaction time.

The precursor added with the reagent is stirred at a preset stirring temperature and for a preset reaction time, which can be adjusted according to actual conditions and are not specifically limited here. The stirring reaction aims to induce a full chemical reaction between the precursor and the added reagents, forming the required core-shell structured fluorescent powder.

Step S7 of drying after the stirring to obtain $K_2TiF_6$:Mn@(Ca,Sr)AlSiN$_3$:Eu.

After the stirring process, the reaction mixture needs to be dried to remove excess moisture and stabilize the chemical structure. The dried product is the final $K_2TiF_6$:Mn@(Ca,Sr)AlSiN$_3$:Eu fluorescent powder.

Preferably, the fourth fluorescent powder is a biphasic structure activated by $Eu^{2+}$ ions, including $Sr_2Si_5N_8$ and $CaAlSiN_3$.

Specifically, in this embodiment, the fourth fluorescent powder is a biphasic structure fluorescent powder activated by $Eu^{2+}$ ions. A biphasic structure means that the powder is composed of two different fluorescent materials. This structure can optimize fluorescent properties such as spectral coverage, luminous efficiency, and thermal stability. The combination of two phases can provide a broader emission spectrum than a single material, contributing to a more comprehensive spectral coverage, especially in the long-wave red light part.

It includes two different compounds: $Sr_2Si_5N_8$ and $CaAlSiN_3$. $Sr_2Si_5N_8$ is a silicon nitride with high luminous efficiency and good thermal stability. $CaAlSiN_3$ is another silicon nitride with similarly excellent chemical stability and high-temperature resistance. The combination of these two materials aims to integrate their respective advantages to achieve high-performance fluorescent characteristics.

$Eu^{2+}$ ions, acting as activators, can effectively excite $Sr_2Si_5N_8$ and $CaAlSiN_3$ to make these materials luminesce. The introduction of Eu2+ ions helps to adjust the wavelength and intensity of luminescence, thereby enhancing the luminous efficiency and color performance of the fluorescent powder. The biphasic structure fluorescent powder activated by $Eu^{2+}$ ions has significant advantages in full-spectrum lighting systems, especially in applications requiring high color reproduction and thermal stability, such as indoor lighting, commercial lighting, and art lighting.

Preferably, in the biphasic structure, $Sr_2Si_5N_8$ is the main phase, and the mixed molar ratio of $Sr_2Si_5N_8$ to CaAlSiN is between 1 and 3.

Specifically, given excellent optical properties of $Sr_2Si_5N_8$, including its wide half-wave width and high luminous efficiency, it is chosen as the main phase in the biphasic structure. As the main phase, $Sr_2Si_5N_8$ occupies a higher proportion in the fluorescent powder, significantly impacting the overall spectrum and light efficiency. When the mixed molar ratio of $Sr_2Si_5N_8$ to CaAlSiN is between 1 and 3, it ensures that the fluorescent powder has an appropriate half-wave width and continuous spectral output, especially in the long-wave red light part. If the proportion of $Sr_2Si_5N_8$ is too low, it might narrow the half-wave width of the fluorescent powder, affecting the continuity of the spectrum, particularly in the long-wave red light region, potentially leading to spectral gaps and impacting the overall optoelectronic parameters. Conversely, if the proportion of $Sr_2Si_5N_8$ is too high, it might prevent the fluorescent powder from effectively reaching the peak wavelength between 680-700 nm, resulting in insufficient spectral output in the long-wave red light region.

In one embodiment, the fourth fluorescent powder with a biphasic structure is prepared using the solid-state method, and the preparation method thereof includes the following steps:

Step S01 of weighing the raw materials according to the mixed molar ratio. Specifically, accurately weigh the required raw materials, such as Sr3N2, Ca3N2, Si3N4, AlN, and EuN, according to the mixed molar ratio of the fourth fluorescent powder. The proportion of these raw materials is crucial for the chemical and optical properties of the final fluorescent powder.

Step S02 of uniformly mixing the weighed raw materials to obtain a mixture. Specifically, the weighed raw materials are mixed and thoroughly stirred to ensure even mixing. A uniform mixture is key to achieving uniformity and consistency in the fluorescent powder, especially in complex chemical reactions involving multiple materials.

Step S03 of sintering the mixture at a second preset sintering temperature and for a second preset sintering time to obtain a sintered material.

The mixed raw materials is placed in a high-temperature furnace for sintering. In this embodiment, the second preset sintering temperature is set between 1400-1500° C., and the second preset sintering time is 8 hours. This step is to promote chemical reactions among the raw materials through high-temperature treatment to form the required fluorescent powder structure. The sintering temperature and time are crucial for the microstructure and fluorescent properties of the fluorescent powder. The second preset sintering temperature and time can be adjusted according to actual conditions.

Step S04 of crushing and washing the sintered material to obtain the fourth fluorescent powder with a biphasic structure.

After sintering, the fluorescent powder needs to be crushed to reduce the particle size and improve the luminous efficiency. It is then washed to remove impurities and by-products that may have formed during the sintering process. The cleaned fluorescent powder has a cleaner and purer surface, which helps to enhance its optical performance. Through these steps, a Eu2+-activated biphasic structure fluorescent powder comprising $Sr_2Si_5N_8$ and $CaAlSiN3$ with excellent optical properties can be prepared. This fluorescent powder, due to its optimized structure and chemical composition, can provide efficient and stable light output in lighting applications. It is particularly suitable for lighting systems that require high color reproduction and high light efficiency.

Embodiment 2

Based on Embodiment 1, Embodiment 2 further extends the design of the full spectrum semiconductor lighting device. This embodiment involves combining blue light LED chips with different peak wavelengths with various fluorescent powders to prepare full spectrum semiconductor lighting devices with diverse characteristics. The specific combinations of blue light chips and fluorescent powder systems used in these different full spectrum lighting devices are detailed in Table 1. Table 1 lists the specific types of blue light chips and fluorescent powders used in various full spectrum semiconductor lighting devices, demonstrating various combination schemes to suit different lighting needs and application scenarios.

TABLE 1

Chip and Fluorescent Powder Combination Schemes for Examples 1-10 and Comparative Examples 1-5

| Example | Chip Combination | Main Wavelength | First Fluorescent Powder | Second Fluorescent Powder | Third Fluorescent Powder | Forth Fluorescent Powder |
|---|---|---|---|---|---|---|
| Example 1 | 442 nm 450 nm 465 nm | 452 nm | $Lu_3(Al_{1-x}, Ga_x)_5O_{12}:z$ Ce, x = 0.2, z = 0.003 | $Lu_3Si_5N_{11}$: Ce | $K_2TiF_6:Mn@$ (Ca, Sr)AlSi $N_3$:Eu at a molar ratio of ½ | $Eu^{2+}$ activated $Sr_2Si_5N_8$ and $CaAlSiN_3$ at a molar ratio of 1 |
| Example2 | 442 nm 450 nm 467 nm | 453 nm | x = 0.1, z = 0.005 | $Lu_3Si_5N_{11}$: Ce | molar ratio of ⅓ | molar ratio of 2 |
| Example3 | 445 nm 452 nm 460 nm | 453 nm | x = 0.3, z = 0.003 | $Lu_3Si_5N_{11}$: Ce | molar ratio of 1 | molar ratio of 3 |
| Example4 | 435 nm 450 nm 470 nm | 455 nm | x = 0.2, z = 0.003 | $Lu_3Si_5N_{11}$: Ce | molar ratio of ½ | molar ratio of 1 |
| Example5 | 435 nm 450 nm 480 nm | 457 nm | x = 0.2, z = 0.008 | $Lu_3Si_5N_{11}$: Ce | molar ratio of ½ | molar ratio of 1 |
| Example6 | 422 nm 445 nm 465 nm | 454 nm | x = 0.2, z = 0.006 | $Lu_3Si_5N_{11}$: Ce | molar ratio of ½ | molar ratio of 1 |
| Example 7 | 425 nm 435 nm 447 nm 472 nm | 455 nm | x = 0.2, z = 0.003 | $Lu_3Si_5N_{11}$: Ce | molar ratio of ½ | molar ratio of 1 |
| Example8 | 435 nm 447 nm 460 nm 480 nm | 457 nm | x = 0.2, z = 0.003 | $Lu_3Si_5N_{11}$: Ce | molar ratio of ½ | molar ratio of 1 |
| Example9 | 445 nm 457 nm | 452 nm | x = 0.2, z = 0.003 | $Lu_3Si_5N_{11}$: Ce | molar ratio of ½ | molar ratio of 1 |
| Example 10 | 442 nm 465 nm | 453 nm | x = 0.2, z = 0.003 | $Lu_3Si_5N_{11}$: Ce | molar ratio of ½ | molar ratio of 1 |

TABLE 1-continued

Chip and Fluorescent Powder Combination Schemes for Examples 1-10 and Comparative Examples 1-5

| Example | Chip Combination | Main Wavelength | First Fluorescent Powder | Second Fluorescent Powder | Third Fluorescent Powder | Forth Fluorescent Powder |
|---|---|---|---|---|---|---|
| Comparative Example 1 | 442 nm 450 nm 467 nm | 460 nm | $Lu_3(Al_{1-x}, Ga_x)_5O_{12}$:z Ce, x = 0.1, z = 0.005 | $Lu_3Si_5N_{11}$:Ce | $K_2TiF_6$:Mn@ (Ca, Sr)AlSi $N_3$:Eu at a molar ratio of ⅓ | $Eu^{2+}$ activated $Sr_2Si_5N_8$ and $CaAlSiN_3$ at a molar ratio of 2 |
| Comparative Example2 | 442 nm 450 nm 467 nm | 445 nm | $Lu_3(Al_{1-x}, Gax)_5O_{12}$: zCe, x = 0.1, z = 0.005 | $Lu_3Si_5N_{11}$:Ce | $K_2TiF_6$:Mn@ (Ca, Sr)AlSi $N_3$:Eu at a molar ratio of ⅓ | $Eu^{2+}$ activated Sr2Si5N8 and $CaAlSiN_3$ at a molar ratio of 2 |
| Comparative Example3 | 442 nm 450 nm 467 nm | 445 nm | BaSi2O2N 2:Eu | $Lu_3Si_5N_{11}$:Ce | (Ca, Sr)AlSi $N_3$:Eu | (Ca, Sr)AlSi $N_3$: Eu |
| Comparative Example4 | 442 nm 450 nm 467 nm | 445 nm | BaSi2O2N 2:Eu | $Lu_3Si_5N_{11}$:Ce | (Ca, Sr)AlSi $N_3$:Eu | $Sr_2Si_5N_8$:Eu |
| Comparative Example5 | 442 nm 450 nm 467 nm | 445 nm | BaSi2O2N 2:Eu | $Lu_3Si_5N_{11}$:Ce | $K_2SiF_6$:Mn | $Sr_2Si_5N_8$:Eu |

Based on the various blue light chip and fluorescent powder combinations provided in Table 1, Embodiment 2 successfully prepared a series of different full spectrum semiconductor lighting devices. To assess the performance of these devices, a series of optoelectronic parameters were tested. The test results are summarized in Table 2, which includes data for full spectrum semiconductor lighting devices from Examples 1-10 and Comparative Examples 1-5. Table 2 shows the performance of each device in terms of key optoelectronic parameters like light efficiency, color temperature, light maintenance rate at 85° C. and 85% humidity, color rendering index, and spectral similarity. These data are crucial for evaluating and comparing the efficacy of different full spectrum lighting devices.

TABLE 2

Test Results of Optoelectronic Parameters for Examples and Comparative Examples

| Example | Light Efficiency (lm/W) | Light Maintenance Rate at 85° C. and 85% Humidity | Color Rendering Index (CRI) | Color Temperature | Spectral Similarity (%) |
|---|---|---|---|---|---|
| Example 1 | 130 | 99% | 98.5 | 5000K | 94% |
| Example 2 | 132 | 99% | 98.3 | 5000K | 96% |
| Example 3 | 134 | 99% | 98.9 | 5000K | 95% |
| Example 4 | 131 | 99% | 99.1 | 5000K | 95% |
| Example 5 | 135 | 99% | 98.7 | 5000K | 94% |
| Example 6 | 142 | 99% | 99.5 | 5000K | 95% |
| Example 7 | 135 | 99% | 98.8 | 5000K | 95% |
| Example 8 | 134 | 99% | 98.9 | 5000K | 96% |
| Example 9 | 135 | 99% | 98.4 | 5000K | 94% |
| Example 10 | 134 | 99% | 98.7 | 5000K | 95% |
| Comparative Example1 | 115 | 98% | 92 | 5000K | 80% |
| Comparative Example2 | 117 | 98% | 91 | 5000K | 78% |
| Comparative Example3 | 100 | 85% | 95 | 5000K | 75% |
| Comparative Example4 | 98 | 84% | 96 | 5000K | 74% |
| Comparative Example4 | 111 | 75% | 87 | 5000K | 68% |
| Comparative Example5 | 119 | 70% | 85 | 5000K | 65% |

In table 2, the Light Maintenance Rate at 85° C. and 85% Humidity refers to the luminous flux maintenance rate after aging for 1000 hours at 85° C. and 85% humidity; the "Spectral Similarity" denotes the similarity of the device's light spectrum to the solar spectrum at the same color temperature within the visible light spectrum range. All the devices in the test are rated at 3W power and are packaged in an EMC5050 package.

The test results demonstrate that the combination of multiband blue light chips for exciting fluorescent powders significantly impacts spectral output, color rendering index, and light efficiency. Combinations with main wavelengths within the 447-457 nm range exhibited the best optoelectronic parameter performance. In contrast, the optoelectronic parameters of traditional phosphor combinations using green phosphor $BaSi_2O_2N_2$:Eu, green phosphor $Lu_3Al_5O_{12}$:Ce, red phosphor $Sr_2Si_5N_8$:Eu, (Ca,Sr)AlSiN$_3$:Eu, or $K_2SiF_6$:Mn alone were relatively inferior. Conversely, fluorescent powder systems suitable for synergistic excitation by long and short-wave blue light showed higher light efficiency, stronger stability, and better spectral similarity, thus more closely resembling the light quality of natural sunlight.

The full-spectrum semiconductor light emitting device of example 6 demonstrates high performance in luminous efficacy, color rendering index, and spectral similarity. The peak wavelengths of the blue light chips used in Embodiment 6 are 422 nm, 445 nm, and 465 nm. After combination, the main wavelength of the blue LED chip is 454 nm. The fluorescent powder system utilized includes the following components:

First fluorescent powder: $Lu_3(Al_{1-x},Ga_x)_5O_{12}:zCe$, where x=0.2 and z=0.006.
Second fluorescent powder: $Lu_3Si_5N_{11}:Ce$.
Third fluorescent powder: $K_2TiF_6:Mn@(Ca,Sr)AlSiN_3:Eu$, with a molar ratio of 1:2.
Fourth fluorescent powder: Eu2+ activated $Sr_2Si_5N_8$ and $CaAlSiN_3$ are mixed homogeneously, with a molar ratio of 1.

These components are combined in specific ratios to achieve desired performance characteristics in Example 6.

From Table 2, it can be observed that the luminous efficacy of Example 6 is 142, which is higher than that of the other examples. This indicates that Example 6 can provide higher light output at the same energy consumption. The lumen maintenance rate of Embodiment 6 after aging for 1000 hours under the conditions of double 85 is 99%, similar to the other embodiments, indicating that the light output can maintain high stability in high-temperature and high-humidity environments. Its color rendering index is 99.5, which is also the highest, indicating that the light source of Embodiment 6 can accurately represent the colors of objects. Furthermore, its spectral similarity is 95%, comparable to the other embodiments, indicating that the emitted light has a high similarity to the ideal light source in terms of spectrum.

Further, Embodiment 2 conducts a test on the emission spectrum of Example 1, with the test results shown in FIG. 1. FIG. 1 displays the emission spectrum of the full spectrum semiconductor lighting device in Example 1. This spectrum graph illustrates the light intensity distribution at different wavelengths, providing important information about the color reproduction and spectral coverage range of the light source. From FIG. 1, it can be observed that the full spectrum semiconductor lighting device exhibits significant emission peaks in multiple wavelength ranges. These peaks correspond to different colors of light emitted by the source. There are several emission peaks in the blue light region (400 nm-500 nm) and green light region (500 nm-600 nm), with the most prominent peak appearing in the red light region (above 640 nm). This spectral characteristic indicates that the light source can provide broad bandwidth coverage, which is crucial for full spectrum lighting. It better simulates natural light, offers good color reproduction, and is beneficial for human visual comfort and health.

Figure 2:
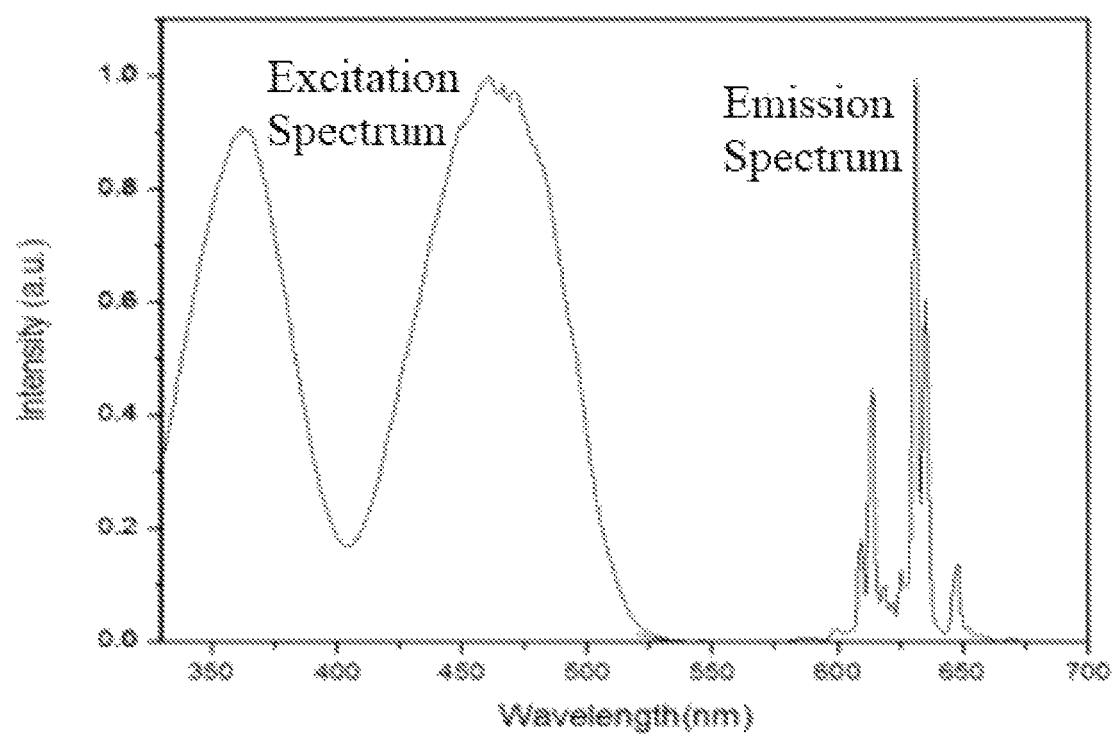
FIG. 2 is the excitation and emission spectral graph of the narrow-band red powder in Example 1 of Embodiment 2.

FIG. 2 presents the excitation and emission spectra of the narrow-band red phosphor used in Example 1. The spectral characteristics of this fluorescent powder are critical for achieving high color rendering index and light efficiency, especially in terms of providing sufficient red light output to mimic natural light.

Figure 3:
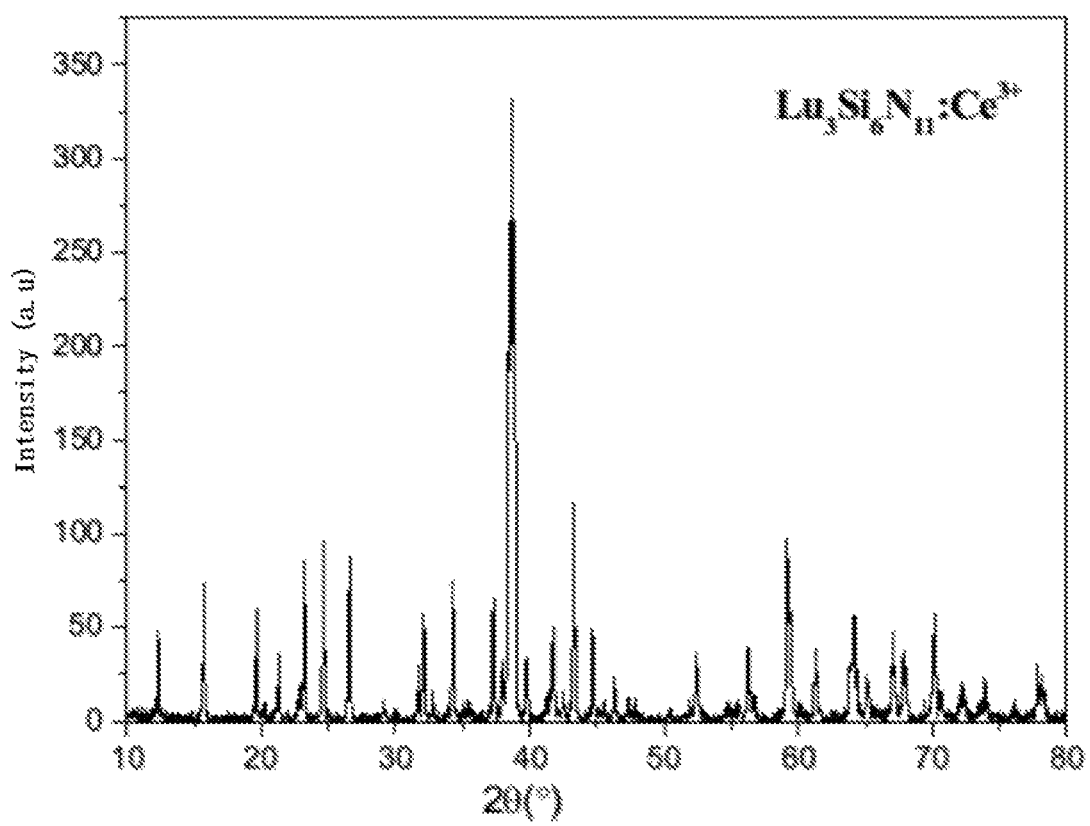
FIG. 3 is the XRD graph of $Lu_3Si_5N_{11}$:Ce.

Furthermore, FIG. 3 shows the X-ray diffraction (XRD) graph of $Lu_3Si_5N_{11}:Ce$ fluorescent powder. The XRD graph provides detailed information about the crystal structure of the fluorescent powder, which is crucial for understanding its optical and physical properties.

These test results and graphs provide a detailed scientific basis for the performance of full spectrum semiconductor lighting devices, showcasing their advantages in various aspects, including the quality of spectral output, characteristics of the fluorescent powder, and crystal structure. Through these data, a better understanding and optimization of these devices can be achieved to meet specific lighting needs.

It should be clear that the present invention is not limited to the specific configurations and processes described above and shown in the drawing. For simplicity, detailed description of known methods is omitted here. In the above embodiments, several specific steps are described and shown as examples. However, the method of the present invention is not limited to the specific steps described and shown. Those skilled in the art can make various changes, modifications and additions, or change the order between the steps within the spirit of the present invention.

Indeed, it should be noted that the exemplary embodiments mentioned in the present invention describe methods or systems based on a series of steps or devices. However, the present invention is not limited to the order of the steps described above. In other words, the steps can be performed in the order mentioned in the embodiments, or they can be performed in a different order or simultaneously.

The above description is only specific embodiments of the present invention. Those skilled in the art will understand that, for the sake of convenience and conciseness, the specific operation processes of the described systems, modules, and units can refer to the corresponding processes described in the previous method embodiments, and are not repeated here. It should be understood that the scope of protection of the present invention is not limited thereto, and any modifications or substitutions that those skilled in the art can easily contemplate within the technical scope disclosed in the present invention are also encompassed within the scope of protection of the present invention.

What is claimed is:

1. A full spectrum semiconductor lighting device, comprising:
   a blue light LED chip;
   a fluorescent powder;
   wherein the blue light LED chip comprise at least two blue light chips with peak wavelengths within a first wavelength range, and peak wavelengths of each blue light chip are different, the first wavelength range is 420~480 nm;
   the fluorescent powder include a first fluorescent powder, a second fluorescent powder, a third fluorescent powder, and a fourth fluorescent powder, the peak wavelength of the first fluorescent powder lies within a second wavelength range, the peak wavelength of the second fluorescent powder lies within a third wavelength range, the peak wavelength of the third fluorescent powder lies within a fourth wavelength range, and the peak wavelength of the fourth fluorescent powder lies within a fifth wavelength range, the second wavelength range is 495-500 nm, the third wavelength range is 530-535 nm, the fourth wavelength range is 645-650 nm, and the fifth wavelength range is 680-690 nm.

2. The full spectrum semiconductor lighting device as defined in claim 1, wherein the main wavelength of the blue light LED chip is between 447~457 nm after combining each of the blue light chips.

3. The full spectrum semiconductor lighting device as defined in claim 1, wherein the chemical formula of the first fluorescent powder is $Lu_3(Al_{1-x},Ga_x)_5O_{12}:zCe$, where $0.1 \leq x \leq 0.3$, and $0.003 \leq z \leq 0.008$.

4. The full spectrum semiconductor lighting device as defined in claim 1, wherein the chemical formula of the second fluorescent powder is $Lu_3Si_5N_{11}:Ce$.

5. The full spectrum semiconductor lighting device as defined in claim 1, wherein the third fluorescent powder is a composite material with a core-shell structure, and the chemical formula thereof is $K_2TiF_6$:Mn@(Ca,Sr)AlSiN$_3$:Eu.

6. The full spectrum semiconductor lighting device as defined in claim 4, wherein the molar ratio of $K_2TiF_6$:Mn to (Ca,Sr)AlSiN$_3$:Eu in the composite material is between ⅓ and 1.

7. The full spectrum semiconductor lighting device as defined in claim 4, wherein a preparation method for the third fluorescent powder $K_2TiF_6$:Mn@(Ca,Sr)AlSiN$_3$:Eu includes the following steps:
   weighing the raw materials according to the chemical formula of the third fluorescent powder,
   grinding the weighed raw materials and mix them evenly to obtain a mixture,
   sintering the mixture at a first preset sintering temperature and for a first preset sintering time to obtain an intermediate,
   crushing and performing post-process on the intermediate to obtain a precursor,
   adding reagents corresponding to the chemical formula of the third fluorescent powder to the precursor,
   stirring the precursor added with the reagent at a preset stirring temperature and for a preset reaction time,
   and, drying after the stirring to obtain K2TiF6:Mn@(Ca,Sr)AlSiN3:Eu.

8. The full spectrum semiconductor lighting device as defined in claim 6, wherein the first preset sintering time is 4~10 hours, the first preset sintering temperature is 1600~1800 degrees centigrade.

9. The full spectrum semiconductor lighting device as defined in claim 1, wherein the fourth fluorescent powder is a biphasic structure activated by $Eu^{2+}$ ions, the biphasic structure comprises $Sr_2Si_5N_8$ and $CaAlSiN_3$.

10. The full spectrum semiconductor lighting device as defined in claim 8, wherein a preparation method of the fourth fluorescent powder comprises the following steps
    weighing raw materials according to the mixed molar ratio,
    uniformly mixing the weighed raw materials to obtain a mixture,
    sintering the mixture at a second preset sintering temperature and for a second preset sintering time to obtain a sintered material,
    and, crushing and washing the sintered material to obtain the fourth fluorescent powder with a biphasic structure.

11. The full spectrum semiconductor lighting device as defined in claim 9, wherein the second present sintering temperature is 1400~1500 degrees centigrade, the second sintering time is 8 hours.

12. The full spectrum semiconductor lighting device as defined in claim 8, wherein $Sr_2Si_5N_8$ is the main phase in the biphasic structure, and the mixed molar ratio of $Sr_2Si_5N_8$ to CaAlSiN is between 1 and 3.

13. A health lighting fixture, comprising at least one full spectrum semiconductor lighting device as described in claim 1.

* * * * *